United States Patent
Murayama et al.

(10) Patent No.: US 8,017,975 B2
(45) Date of Patent: Sep. 13, 2011

(54) SEMICONDUCTOR DEVICE

(75) Inventors: Keiichi Murayama, Toyama (JP); Akiyoshi Tamura, Osaka (JP); Hirotaka Miyamoto, Toyama (JP); Kenichi Miyajima, Toyama (JP)

(73) Assignee: Panasonic Corporation, Osaka (JP)

( * ) Notice: Subject to any disclaimer, the term of this patent is extended or adjusted under 35 U.S.C. 154(b) by 171 days.

(21) Appl. No.: 12/400,376

(22) Filed: Mar. 9, 2009

(65) Prior Publication Data

US 2009/0230431 A1      Sep. 17, 2009

(30) Foreign Application Priority Data

Mar. 13, 2008   (JP) .................................. 2008-064806

(51) Int. Cl.
   *H01L 29/66*       (2006.01)

(52) U.S. Cl. .......... 257/183; 257/E27.015; 257/E21.371

(58) Field of Classification Search .................. 257/192, 257/197, 273, E27.015, E21.371, 47, 183, 257/187

See application file for complete search history.

(56) References Cited

U.S. PATENT DOCUMENTS

| | | |
|---|---|---|
| 5,012,318 A | 4/1991 | Honjo |
| 5,250,826 A | 10/1993 | Chang et al. |
| 5,567,961 A | 10/1996 | Usagawa et al. |
| 2005/0045911 A1 | 3/2005 | Hill et al. |
| 2005/0184310 A1 | 8/2005 | Krutko et al. |
| 2008/0217625 A1 | 9/2008 | Kuroda et al. |
| 2008/0230806 A1 | 9/2008 | Pan et al. |
| 2008/0251837 A1 | 10/2008 | Kato et al. |
| 2008/0296624 A1 | 12/2008 | Murayama et al. |
| 2009/0015293 A1 | 1/2009 | Ito et al. |
| 2009/0078943 A1 | 3/2009 | Ishida et al. |

*Primary Examiner* — Thomas L Dickey
*Assistant Examiner* — Nikolay Yushin
(74) *Attorney, Agent, or Firm* — Greenblum & Bernstein, P.L.C.

(57) ABSTRACT

A semiconductor device and manufacturing method satisfies both of the trade-off characteristic advantages of the HBT and the HFET. The semiconductor device is an HBT and HFET integrated circuit. The HBT includes a sub-collector layer, a GaAs collector layer, a GaAs base layer, and an InGaP emitter layer that are sequentially stacked. The sub-collector layer includes a GaAs external sub-collector region, and a GaAs internal sub-collector region disposed on the GaAs external sub-collector region. A mesa-shaped collector part and a collector electrode are separately formed on the GaAs external sub-collector region. The HFET includes a GaAs cap layer, a source electrode, and a drain electrode. The GaAs cap layer includes a portion of the GaAs external sub-collector region. The source electrode and the drain electrode are formed on the GaAs cap layer.

4 Claims, 4 Drawing Sheets

SEMICONDUCTOR DEVICE

BACKGROUND OF THE INVENTION (1) Field of the Invention

The present invention relates to an HBT (heterojunction bipolar transistor) and HFET (heterojunction field-effect transistor) integrated circuit (Bi-HFET) used as a high-frequency semiconductor device and to a manufacturing method thereof.

(2) Description of the Related Art

Heterojunction bipolar transistors (HBT) having semiconductors with large bandgaps in emitters have been brought into practical use as high-frequency analogue elements used in cellular phones and the like. Having low temperature dependence, InGaP/GaAs HBTS utilizing InGaP as emitters in particular are expected to enjoy more and more various applications to highly reliable devices.

Recently, research and development projects have advanced for integrated circuits integrating an HBT and a heterojunction field-effect transistor (HFET), so that a switch element (SW) including the HFET can control a power amplifier (PA) including the HBT. Thus, a Bi-HFET process technology which forms an HBT and an HFET on the same substrate has attracted attention. A typical Bi-HFET structure includes an HBT disposed on the topside (on a surface side) and an HFET disposed on the bottom side (on a rear-face side) with respect to a substrate. Such a structure, sharing the same n-GaAs layer with a sub-collector layer of the HBT and a cap layer of the HFET, can reduce the number of masks and lower steps in the structure.

In the sharing with the sub-collector layer and the cap layer, the sub-collector layer of the HBT has a characteristic advantage in that on-resistance of the HBT decreases as the sub-collector layer thickens; meanwhile, the cap layer of the HFET has a characteristic advantage in that the recess structure thereof can be refined as the cap layer thins, and thus on-resistance of the HFET can be decreased. Hence, the characteristic advantages between the HBT and the HFET mean a trade-off relationship. A semiconductor device described in Patent Reference 1 has been proposed as a technique to solve the above problem.

FIG. 4 is a cross-sectional view illustrating a structure of the semiconductor device described in Patent Reference 1. This semiconductor device has regions with an HBT and an HFET formed (respectively referred to as an HBT region and an HFET region). The HFET region and the HFET region are electrically separated by an injected element separating region 720.

In the HFET region, a GaAs/AlGaAs superlattice layer 402, an AlGaAs barrier layer 403, an InGaAs channel layer 404, an electron donor layer 406 and a GaAs cap layer 405 are sequentially stacked on a semi-insulating GaAs substrate 401. A source electrode 304 and a drain electrode 305 are formed on the GaAs cap layer 405, and a gate electrode 306 is formed on the electron donor layer 406.

In the HBT region, the GaAs/AlGaAs superlattice layer 402, the AlGaAs barrier layer 403, the InGaAs channel layer 404, the electron donor 406, a GaAs sub-collector layer 407 sharing the same layer with the GaAs cap layer 405, a GaAs collector layer 408, a GaAs base layer 409, an InGaP emitter layer 410, a GaAs emitter cap layer 411, and an InGaAs emitter contact layer 412 are sequentially stacked on the GaAs substrate 401. On the GaAs sub-collector layer 407, the GaAs base layer 409, and the InGaAs emitter contact layer 412, a collector electrode 203, a base electrode 202 and an emitter electrode 201 are formed, respectively.

In order to minimize characteristic degradation of the HBT and the HFET in accordance with the trade-off between the characteristic advantages of the HBT and the HFET, this semiconductor device defines that the GaAs sub-collector layer 407 sharing the same layer with the GaAs cap layer 405 is 300 nm in thickness. It is noted that the Patent Reference 1 (US 2005/0184310) provides a detailed description on a manufacturing method of the semiconductor device.

SUMMARY OF THE INVENTION

The semiconductor device described in Patent Reference 1 causes a problem described hereinafter in satisfying both of the characteristic trade-off advantages between the HBT and the HFET.

In other words, the 300 nm-thickness of the GaAs sub-collector layer 407 causes a problem to increase a collector resistance. Meanwhile, the 300 nm-thickness of the GaAs cap layer 405 causes a problem to increase the on-resistance of the HFET. As shown in FIG. 2B, a calculational collector resistance of the HBT increases in 5Ω from 12Ω to 17Ω, compared with a conventional semiconductor device (a semiconductor device of which GaAs sub-collector layer and a GaAs cap layer not having 300 nm in thickness). Compared with the conventional semiconductor device, the on-resistance of the HFET also increases in 0.5Ω from 1.5Ω to 2.0Ω. Thus, even the semiconductor device described in Patent Reference 1 cannot satisfy both of the characteristic advantages of the HBT and the HFET.

Thus, the present invention is conceived in view of the above problems and has as an objective to provide a semiconductor device to satisfy both of the trade-off characteristic advantages of the HBT and the HFET and a manufacturing method thereof.

In order to solve the above problems, the present invention is a semiconductor device including a heterojunction bipolar transistor and a heterojunction field effect transistor formed on the same semiconductor substrate, wherein: the heterojunction bipolar transistor includes a sub-collector layer, a collector layer, a base layer, and an emitter layer which are sequentially stacked; the sub-collector layer includes an external sub-collector region, and an internal sub-collector region disposed on the external sub-collector region; a mesa-shaped collector part and a collector electrode are separately formed on the external sub-collector region, the collector part including the base layer, the emitter layer, the collector layer, and the internal sub-collector region; and the heterojunction field effect transistor includes a cap layer, a source electrode, and a drain electrode, the cap layer including portion of the external sub-collector region, and the source electrode and the drain electrode being formed on the cap layer.

This structure allows the cap layer of the HFET to include the external sub-collector region, and collector part to include the internal sub-collector region. Accordingly, the present invention can provide a single semiconductor layer to be shared with sub-collector layer of the HBT and the cap layer of the HFET, which leads to reduction of the number of masks in a manufacturing process of the semiconductor device. Further, this structure allows: the cap layer to be thin with the external sub-collector region thinned and with the sub-collector layer eliminating the need to be thin in the collector part; and the recess length of the HFET to be reduced. Accordingly, the present invention can reduce the on-resistance of the HFET. In addition, this structure allows the internal sub-collector region to be thick with the cap layer eliminating the need to be thick, and the collector resistance of the HBT to be reduced. Accordingly, the present invention can reduce the on-resistance of the HBT. As a result, the present invention can implement a semiconductor device satisfying both of the trade-off characteristic advantages between the HBT and the HFET, dispensing with an increase in the number of masks required for forming the Bi-HFET.

Further, the present invention is a method for manufacturing a semiconductor device including a heterojunction bipolar transistor and a heterojunction field effect transistor which are formed on a same semiconductor substrate. The method includes: sequentially stacking a sub-collector layer, a collector layer, a base layer, and a emitter layer; etching the sub-collector layer, the collector layer, the base layer, and the emitter layer in order to form a mesa-shaped collector part including the sub-collector layer, the collector layer, the base layer, and the emitter layer; and stacking a collector electrode, a source electrode, and a drain electrode on a surface of portion of the sub-collector layer exposed by the etching, the portion of sub-collector layer not composing the collector part.

This manufacturing method allows a single mask process to process portion of the sub-collector layer, the collector layer, the base layer, and the emitter layer in a mesa shape in order to form the collector part. Accordingly, the present invention can manufacture a high-performance Bi-HFET, dispensing with an increase in the number of processes.

The present invention makes possible manufacturing of a Bi-HFET realizing both of a low-resistance HBT and a low-resistance HFET, eliminating the need for an increase in the number of masks required for the manufacturing thereof. Therefore, the present invention can result in achieving a low-cost and high-performance Bi-HFET and providing a significant contribution to commercial availability of Bi-HFETS.

FURTHER INFORMATION ABOUT TECHNICAL BACKGROUND TO THIS APPLICATION

The disclosure of Japanese Patent Application No. 2008-064806 filed on Mar. 13, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

Hereinafter, an HBT and HFET integrated circuit (Bi-HFET) and a manufacturing method thereof in an embodiment of the present invention are described with reference to the drawings.

Figure 1A:
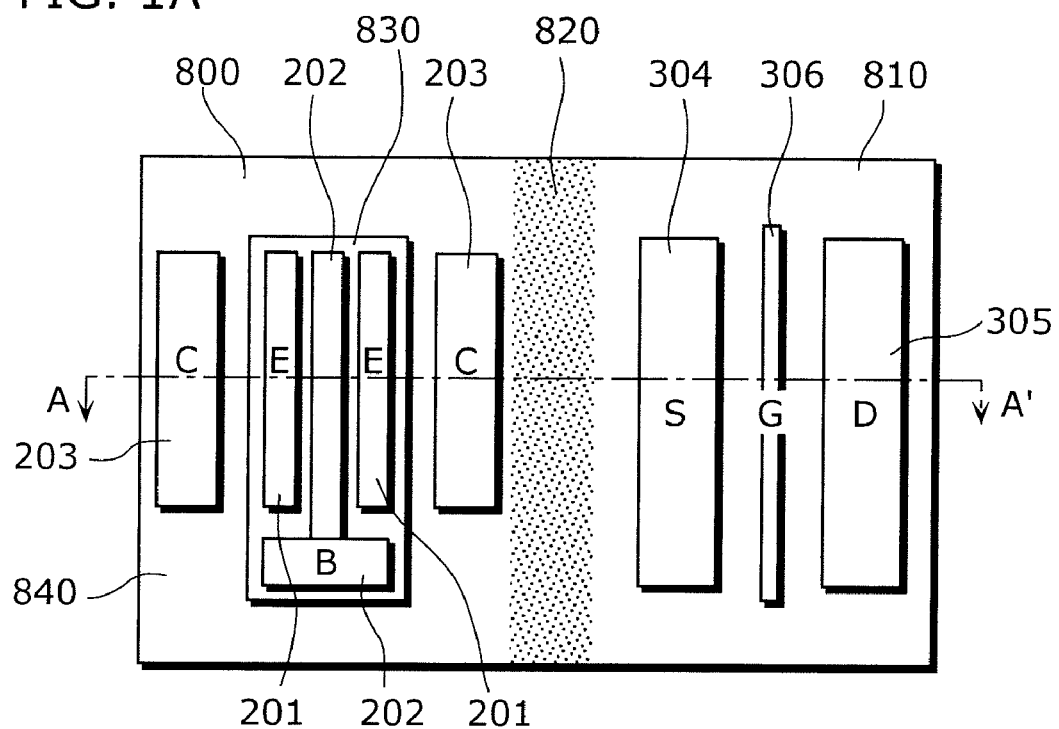
FIG. 1A is a top view illustrating a Bi-HFET structure in an embodiment of the present invention.
Figure 1B:
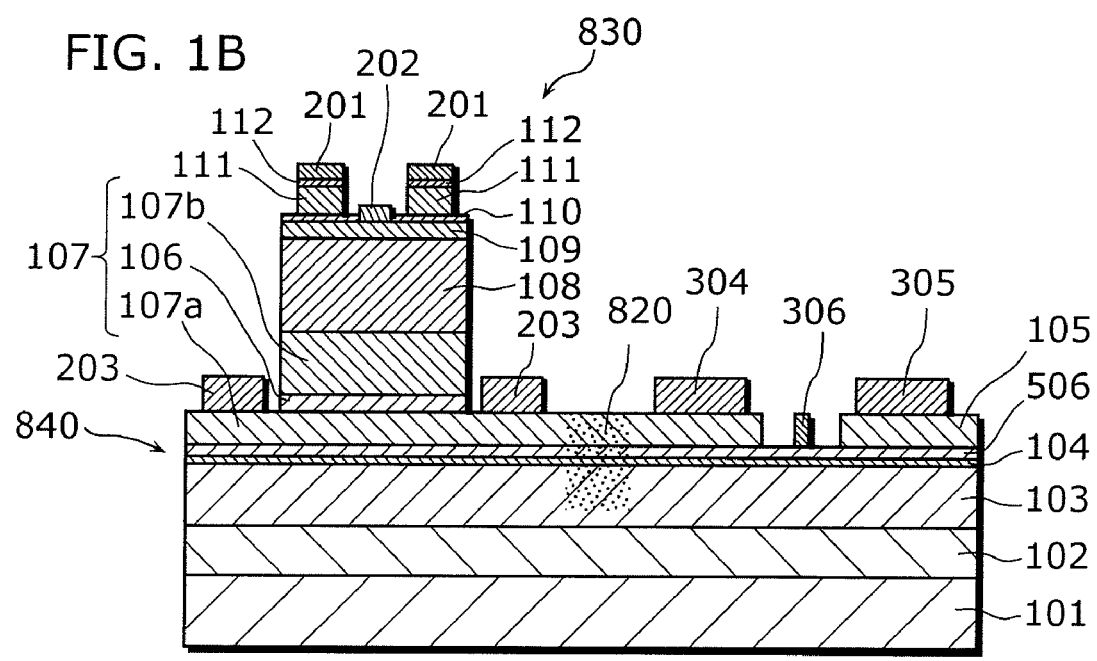
FIG. 1B is a cross-sectional view taken from line A-A' of FIG. 1A illustrating the Bi-HFET structure.

FIG. 1A is a top view illustrating a Bi-HFET in the embodiment of the present invention. Meanwhile, FIG. 1B is a cross-sectional view taken from line A-A' of FIG. 1A showing a Bi-HFET structure.

This Bi-HFET, a semiconductor device having an HBT and an HFET formed on the same semiconductor substrate, includes regions with the HBT and the HFET formed (respectively referred to as an HBT region 800 and an HFET region 810). The HBT region 800 and the HFET region 810 are electrically separated by an injected element separating region 820.

In the HFET region 810, a GaAs/AlGaAs superlattice layer 102, an AlGaAs barrier layer 103, an InGaAs channel layer 104, an electron donor layer 506, and a GaAs cap layer 105 are sequentially stacked on a semi-insulating GaAs substrate layer 101. The source electrode 304 and the drain electrode 305 are formed on the GaAs cap layer 105, and the gate electrode 306 is formed on the electron donor layer 506.

In the HBT region 800, the GaAs/AlGaAs superlattice layer 102, the AlGaAs barrier layer 103, the InGaAs channel layer 104, the electron donor layer 506, a sub-collector layer 107, a GaAs collector layer 108, a GaAs base layer 109, an InGaP emitter layer 110, a GaAs emitter cap layer 111, and an InGaAs emitter contact layer 112 are sequentially stacked on the semi-insulating GaAs substrate layer 101. The sub-collector layer 107 includes a GaAs external sub-collector region 107a disposed on the electron donor layer 506, an InGaP etching stopper region 106 disposed on the GaAs external sub-collector region 107a, and a GaAs internal sub-collector region 107b disposed on the InGaP etching stopper region 106. On the sub-collector layer 107 (the GaAs external sub-collector region 107a), the GaAs base layer 109, and the InGaAs emitter contact layer 112, the collector electrode 203, the base electrode 202, and the emitter electrode 201 are formed, respectively. The collector electrode 203 is formed as high as the source electrode 304 and the drain electrode 305 of the HFET.

Here, the GaAs external sub-collector region 107a has a thickness of 200 nm in a stacking direction thereof (in a stacking direction of the sub-collector layer 107). The GaAs internal sub-collector region 107b is 400 nm thick in a stacking direction thereof. The InGaP etching stopper region 106 is 30 nm thick in a stacking direction thereof. Further, the GaAs cap layer 105 includes a part of the GaAs external sub-collector region 107a.

In the HBT region 800, a mesa-shaped collector part 830 and a collector outer part 840 other than the collector part 830 are formed. The collector part 830 includes the InGaP etching stopper region 106, the GaAs internal sub-collector region 107b, the GaAs collector layer 108, the GaAs base layer 109, the InGaP emitter layer 110, the a GaAs emitter cap layer 111, and the InGaAs emitter contact layer 112. With not more than 1.5 μm apart from the collector electrode 203, the collector part 830 is formed on the sub-collector layer 107 (GaAs external sub-collector region 107a). The collector outer part 840, abutting on the collector part 830, includes the GaAs/AlGaAs superlattice layer 102, the AlGaAs barrier layer 103, the InGaAs channel layer 104, the electron donor layer 506, and the GaAs external sub-collector region 107a.

Figures 2A, 2B:
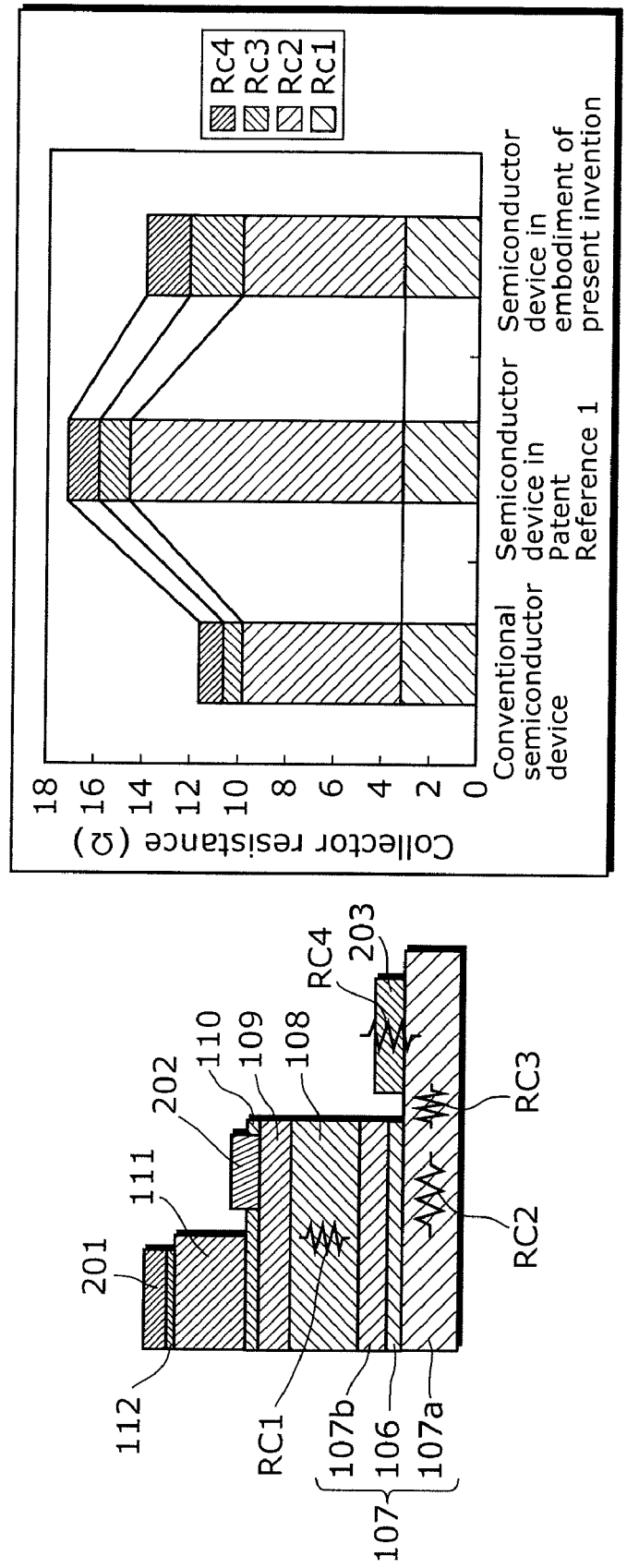
FIG. 2A illustrates each of components of a collector resistance in an HBT.
FIG. 2B illustrates a simulation result of the collector resistance in the HBT.

Next, the characteristics of the HBT in the Bi-HFET having the above structure shall be described. FIG. 2A illustrates each component of a collector resistance in the HBT. FIG. 2B shows a calculated collector resistance in an HBT with use of a device simulation with respect to the Bi-HFET in the embodiment of the present invention, the conventional Bi-HFET, and the Bi-HFET in Patent Reference 1.

FIG. 2A shows that the collector resistance can be separated into each of components; namely, internal resistance of the collector RC1, internal sub-collector resistance RC2, external sub-collector resistance RC3, and collector contact resistance RC4.

FIG. 2B shows that the internal sub-collector resistance RC2 contributes most to the collector resistance. Hence, a lower internal sub-collector resistance RC2 in the HBT; that is a thicker GaAs internal sub-collector region 107b, is most effective in reducing the collector resistance (reducing the on-resistance).

As described above, the Bi-HFET in the embodiment includes the sub-collector layer 107 having two regions; namely, the GaAs external sub-collector region 107a and the GaAs internal sub-collector region 107b. The GaAs cap layer 105 includes the GaAs external sub-collector region 107a in the HFET, and the collector part 830 includes the GaAs internal sub-collector region 107b. Accordingly, sharing the same n-GaAs layer with the sub-collector layer in the HBT and the cap layer in the HFET makes possible a reduction of the number of masks in the manufacturing of a semiconductor device. Further, reducing the recess length in the HFET by thinning the GaAs cap layer 105 with the GaAs external sub-collector region 107a thinned and with the sub-collector layer 107 eliminating the need to be thin in the collector part 830, the present invention can reduce the on-resistance of the HFET. Moreover, reducing the collector resistance in the HBT with the GaAs internal sub-collector region 107b thickened and with the GaAs cap layer 105 eliminating the need to be thick, the present invention can reduce the on-resistance in the HBT. Calculational on-resistance in the HBT and the HEFT can be reduced to 14Ω and 1.5Ω, respectively.

Figure 3:
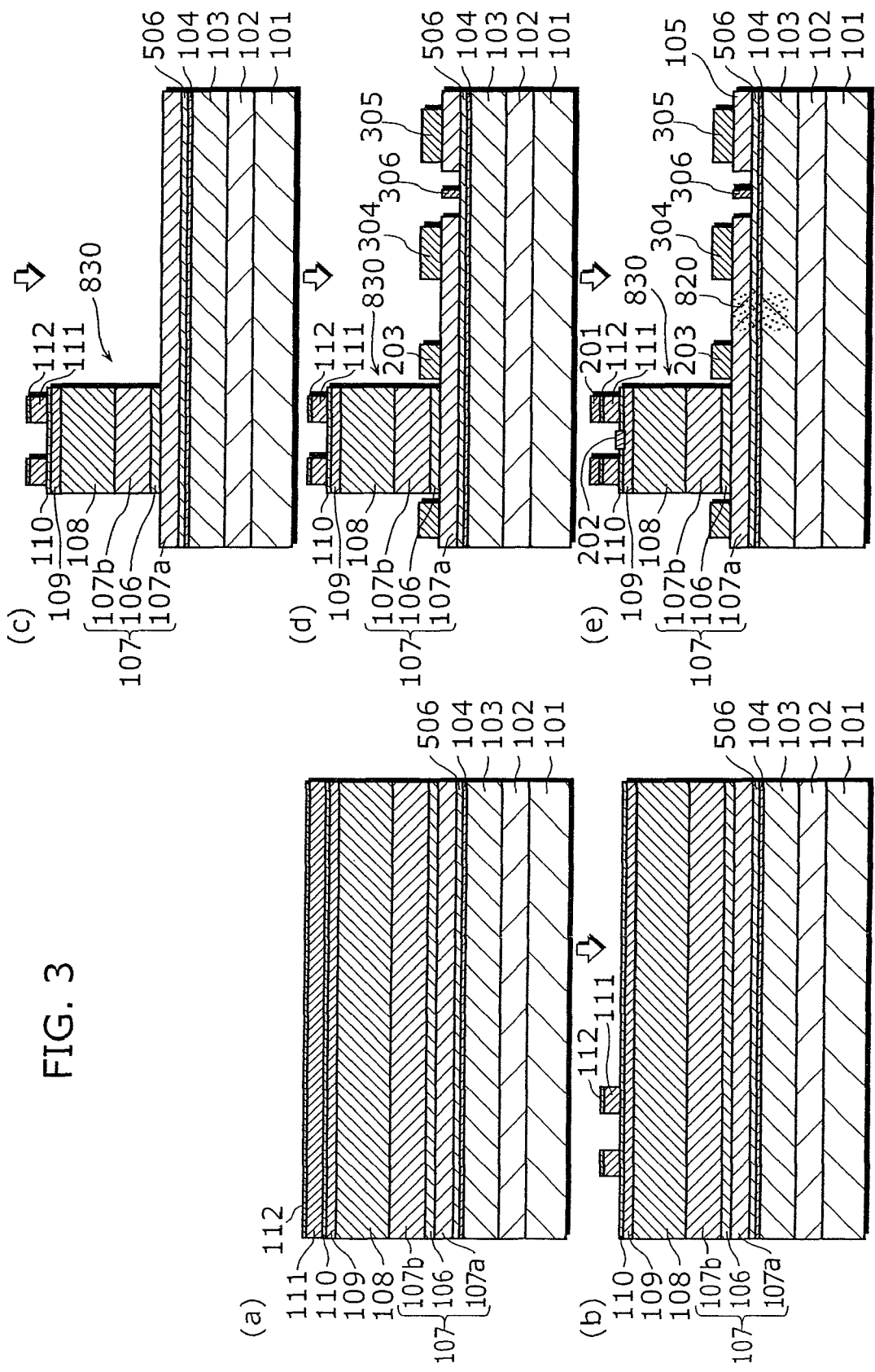
FIG. 3 shows cross-sectional views illustrating a manufacturing method of the Bi-HFET.
Figure 4:
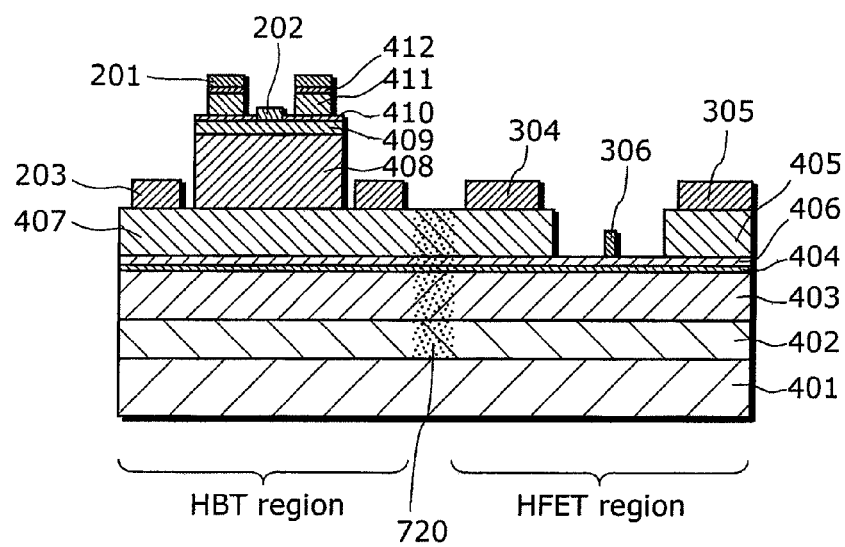
FIG. 4 is a cross-sectional view illustrating a structure of a semiconductor device described in Patent Reference 1.

Next, a manufacturing method of the Bi-HFET in the embodiment shall be described with reference to FIG. 3. FIG. 3 illustrates cross-sectional views showing the manufacturing method of the Bi-HFET.

First, as shown in FIG. 3(a), the GaAs/AlGaAs superlattice layer 102, the AlGaAs barrier layer 103, the InGaAs channel layer 104, the electron donor layer 506, the sub-collector layer 107, the GaAs collector layer 108, the GaAs base layer 109, the InGaP emitter layer 110, the GaAs emitter cap layer 111, and the InGaAs emitter contact layer 112 are sequentially stacked on the semi-insulating GaAs substrate layer 101 by the epitaxial growth.

Next, as shown in FIG. 3(b), the InGaAs emitter contact layer 112 and the GaAs emitter cap layer 111 are etched and formed in a mesa.

Then, as shown in FIG. 3(c), the InGaP emitter layer 110, the GaAs base layer 109, the GaAs collector layer 108, and portion of the sub-collector layer 107 (the GaAs internal sub-collector region 107b and the InGaP etching stopper region 106) are etched to form a mesa-shaped collector part 830.

Here, the dry etching, using Cl-based (chlorine-based) etching gas including $Cl_2$, is employed for etching the InGaP emitter layer 110, the GaAs base layer 109, the GaAs collector layer 108, the GaAs internal sub-collector region 107b, and the InGaP etching stopper region 106. This dry etching, performed until the surface of the InGaP etching stopper region 106 is exposed, makes possible a high-precision selective etching at the InGaP etching stopper region 106.

Then, as shown in FIG. 3(d), the collector electrode 203 of the HBT, the source electrode 304, and the drain electrode 305 of the HFET are simultaneously formed on the etched portion of the sub-collector layer 107; that is, portion of the sub-collector layer 107 (the GaAs external sub-collector region 107a) not composing the collector part 830 and whose surface is not exposed by the dry etching.

Finally, the Bi-HFET is formed, as shown in FIG. 3(e), through the following processes; that is, a process for forming the emitter electrode 201 and the base electrode 202, a process for forming the injected element separating region 820 electrically separating the HBT and the HFET in order to designate portion of the GaAs external sub-collector region 107a to be the GaAs cap layer 105, a process for forming the gate-recess structure for the GaAs cap layer 105, and a process for forming the gate electrode 306. Detailed descriptions of the processes shall be omitted here.

As described above, the manufacturing method of the Bi-HFET in the present embodiment enables the collector part 830 to be formed in an almost vertical mesa shape. This can move the collector electrode 203 close to the collector part 830 as near as 1.5 µm or closer. Hence, the result of the above permits a reduction of the external sub-collector resistance RC3 shown in FIG. 2, and accordingly, a further reduction of the on-resistance of the HBT in the Bi-HFET.

The above has described the semiconductor device and the manufacturing method thereof; meanwhile, the present invention shall not be limited to this. Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

For example, the GaAs internal sub-collector region 107b is assumed to have the thickness of 400 nm. Meanwhile, the GaAs internal sub-collector region 107b having a thickness of not thinner than 300 nm can reduce the internal sub-collector resistance RC2. Thus, the thickness of the GaAs internal sub-collector region 107b is not limited to 400 nm as far as the thickness is 300 nm or more. Similarly, the GaAs external sub-collector region 107a is assumed to have the thickness of 200 nm. Meanwhile, reduction of the on-resistance caused by reduction of a recess length of the HFET is significantly achieved as far as the GaAs external sub-collector region 107a has a thickness between not less than 50 nm and not more than 300 nm. Thus the thickness of the GaAs external sub-collector region 107a is not limited to 200 nm as far as the thickness is between not less than 50 nm and not more than 300 nm.

Further, in the sub-collector layer 107, the InGaP etching stopper region 106 is assumed to be inserted between the GaAs external sub-collector region 107a and the GaAs internal sub-collector region 107b. However, an etching stopper region shall not be limited to a region having InGaP as far as the etching stopper region is made of a semiconductor material different from those of the GaAs external sub-collector region 107a and the GaAs internal sub-collector region 107b.

INDUSTRIAL APPLICABILITY

The present invention is used for a semiconductor device and a manufacturing method thereof. In particular, the present invention is used for a Bi-HFET and a manufacturing method thereof.

What is claimed is:

1. A semiconductor device, comprising:

a heterojunction bipolar transistor and a heterojunction field effect transistor formed on a same semiconductor substrate, wherein the heterojunction bipolar transistor includes a sub-collector layer, a collector layer, a base layer, and an emitter layer which are sequentially stacked, said sub-collector layer includes an external sub-collector region, and an internal sub-collector region disposed on said external sub-collector region, a mesa-shaped collector part and a collector electrode are separately formed on said external sub-collector region, said collector part including said base layer, said emitter layer, said collector layer, and said internal sub-collector region, the heterojunction field effect transistor includes a cap layer, a source electrode, and a drain electrode, said cap layer including a portion of said external sub-collector region, and said source electrode and said drain electrode being formed on said cap layer, said cap layer is stacked commonly with said external sub-collector region, and has a same thickness as a thickness of said external sub-collector region, said external sub-collector region has a thickness between not less than 50 nm and not more than 300 nm, and said internal sub-collector region has a thickness of not less than 300 nm.

2. The semiconductor device according to claim 1, wherein said collector electrode is separated from said collector part by not more than 1.5 μm in distance.

3. The semiconductor device according to claim 2, wherein said sub-collector layer further includes an etching stopper region, which is inserted between said internal sub-collector region and said external sub-collector region, and which is made of a different material from a material of said external sub-collector region and said internal sub-collector region.

4. The semiconductor device according to claim 1, wherein said sub-collector layer further includes an etching stopper region, which is inserted between said internal sub-collector region and said external sub-collector region, and which is made of a different material from a material of said external sub-collector region and said internal sub-collector region.

* * * * *